United States Patent
Gerlach

(10) Patent No.: US 7,387,859 B2
(45) Date of Patent: Jun. 17, 2008

(54) METHOD FOR MEASURING OVERLAY SHIFT

(75) Inventor: Steffen Gerlach, Giessen (DE)

(73) Assignee: Vistec Semiconductor Systems GmbH, Weilburg (DE)

(*) Notice: Subject to any disclaimer, the term of this patent is extended or adjusted under 35 U.S.C. 154(b) by 720 days.

(21) Appl. No.: 10/892,119

(22) Filed: Jul. 16, 2004

(65) Prior Publication Data

US 2005/0037270 A1    Feb. 17, 2005

(30) Foreign Application Priority Data

Aug. 14, 2003  (DE)  ............................. 103 37 767

(51) Int. Cl.
*G03F 9/00*    (2006.01)
(52) U.S. Cl. .......................................... 430/22; 430/30
(58) Field of Classification Search .................. 430/22, 430/30
See application file for complete search history.

(56) References Cited

U.S. PATENT DOCUMENTS 5,989,761 A * 11/1999 Kawakubo et al. ........... 430/22

* cited by examiner

*Primary Examiner*—Christopher G Young
(74) *Attorney, Agent, or Firm*—Foley & Lardner LLP

(57) ABSTRACT

A method for measuring overlay shift is disclosed. An image is acquired of at least one reference element that comprises at least one first pattern element in a first plane and at least one second pattern element in a second plane. An image of a measurement element is likewise acquired. The shift value between the reference element and measurement element is ascertained by comparing the image of the reference element with the image of the measurement element. An output on a user interface indicates whether a predefined tolerance value is being exceeded.

19 Claims, 6 Drawing Sheets

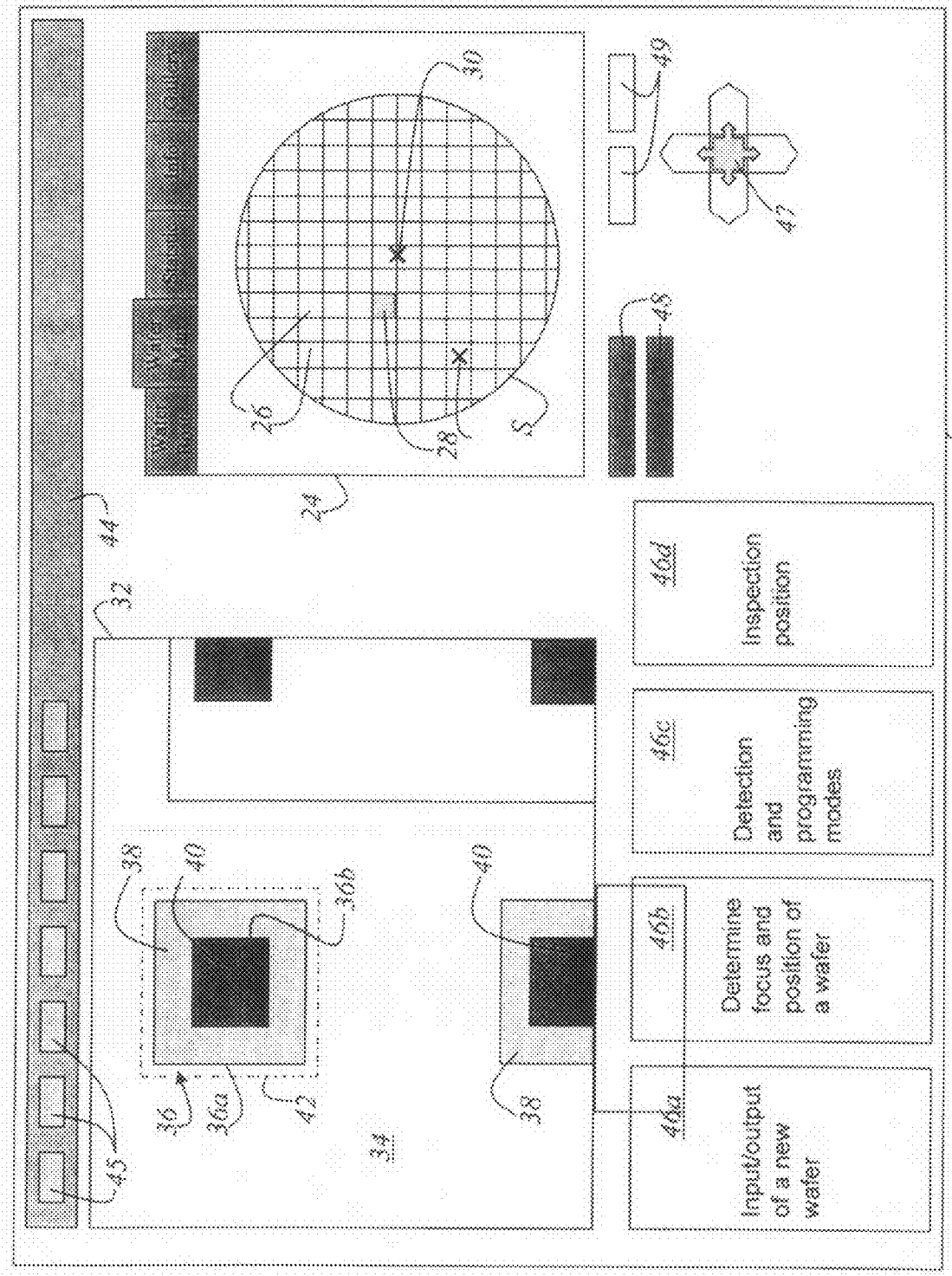

METHOD FOR MEASURING OVERLAY SHIFT

CROSS REFERENCE TO RELATED APPLICATIONS

This application claims priority of the German patent application 103 37 767.0 which is incorporated by reference herein.

FIELD OF THE INVENTION

The invention concerns a method for measuring overlay shift.

BACKGROUND OF THE INVENTION

In the production of a semiconductor module, its patterns are fabricated in a variety of planes. A completed semiconductor module encompasses a plurality of planes in which the individual patterns are located. The orientation of the individual planes with respect to one another is of considerable importance. If a plane were shifted too much with respect to a previous or subsequent plane, this could result in an interruption of the connection between elements in one plane and the next. The orientation, shifting, and alignment of two successive planes is referred to as "overlay shift." In semiconductor production, wafers are sequentially processed during the production process in a plurality of process steps. As integration density increases, requirements in terms of the quality of the patterns configured on the wafers become more stringent. To allow the quality of the configured patterns to be checked and any defects to be discovered, commensurate demands are placed on the quality, accuracy, and reproducibility of the components and process steps with which the wafers are handled. This means that in the production of a wafer, with the many process steps and many layers of photoresist or the like that must be applied, reliable and prompt detection of defects is particularly important. Equally significant for the quality of a semiconductor component is the overlay of the individual planes in the semiconductor component. It is thus particularly important that the shift of the individual planes remain within a tolerance range.

SUMMARY OF THE INVENTION

It is the object of the invention to create a method with which the overlay (the shift of successive planes) of a semiconductor substrate can be determined in simple fashion.

This object is achieved by way of a method for measuring overlay shift, comprising the following steps:

acquiring an image of at least one reference element that has at least one first pattern element in a first plane and at least one second pattern element in a second plane;

traveling to at least one measurement element and acquiring an image of the measurement element;

ascertaining a shift value between the reference element and the at least one measurement element by comparing the image of the reference element with the image of the measurement element; and generating an output if the shift value between the reference element and the measurement element exceeds a predefined tolerance value.

It is particularly advantageous if the following steps are performed in order to measure the overlay shift. Firstly, at least one image is acquired of a reference element that comprises at least one first pattern element in a first plane and at least one second pattern element in a second plane. Then at least one measurement element is traveled to, and an image of the measurement element is acquired. A shift value between the reference element and the at least one measurement element is then ascertained by comparing the image of the reference element with the image of the measurement element. If a predefined tolerance value is exceeded, an output to an operator is made on a user interface.

Several reference elements on one substrate can also be imaged, an average for evaluation of the measurement elements then being determined therefrom.

It is particularly advantageous if the reference element comprises a first pattern element that surrounds the second pattern element. The first pattern element and the second pattern element can each be constructed from an n-sided polygon. It is particularly suitable for determination of the overlay if the first pattern element and the second pattern element are each constructed from a regular rectangle or a square.

The operator selects a reference element, for example, via a user interface in such a way that a border is drawn around the reference element. The inspection arrangement encompasses a microscope that is equipped with a camera which acquires an image of a substrate region, of the reference element, and/or of the measurement element. The comparison of the image of the reference element with the image of the measurement element is performed by sub-pixel-accuracy pattern matching.

BRIEF DESCRIPTION OF THE DRAWINGS

The subject matter of the invention is depicted schematically in the drawings and will be described below with reference to the Figures, in which:

FIG. 2 schematically depicts a user interface with which a user performs the overlay check;

DETAILED DESCRIPTION OF THE INVENTION

Figure 1:
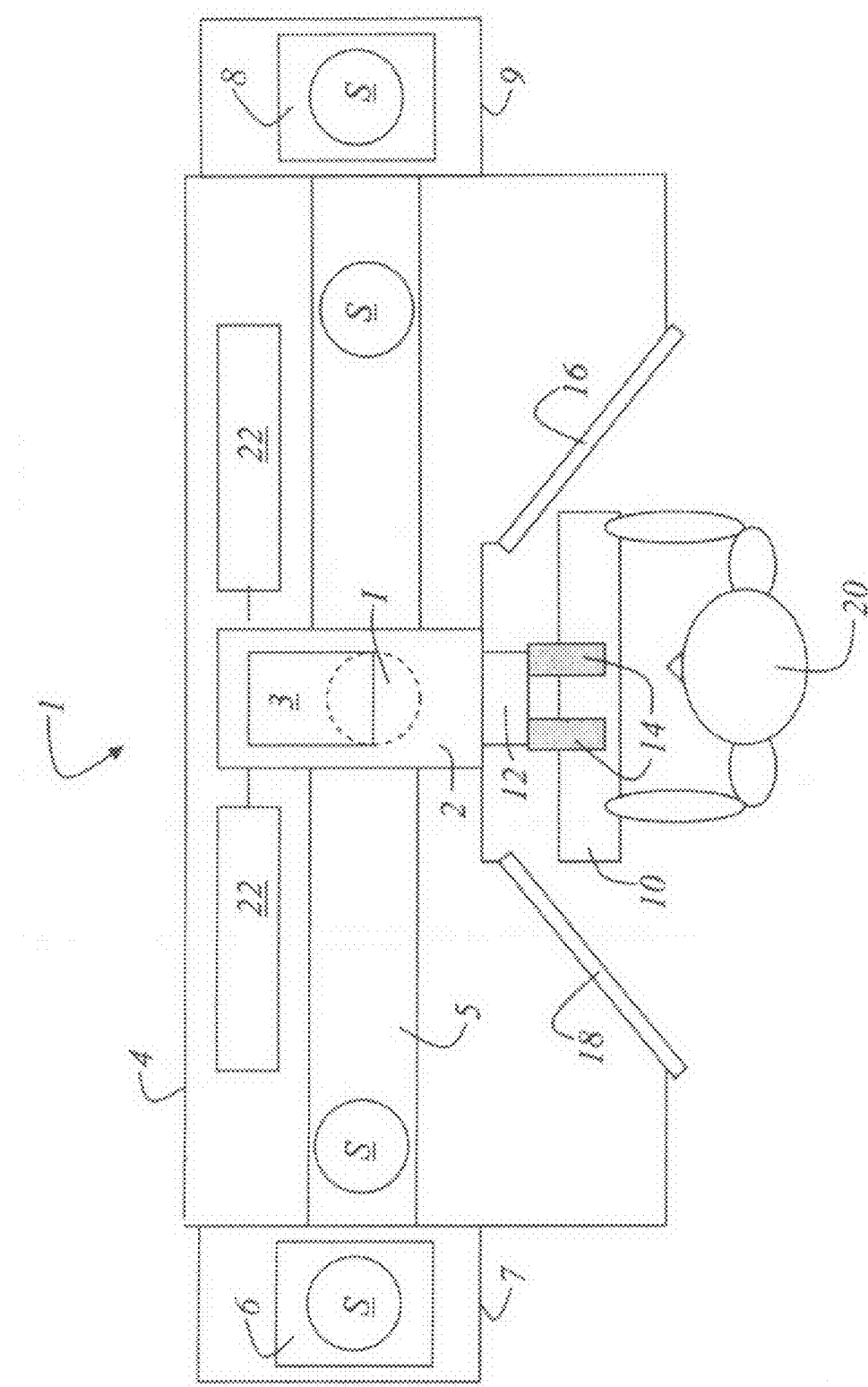
FIG. 1 schematically depicts a system for ascertaining the overlay in semiconductor substrates.

FIG. 1 shows an exemplary embodiment of an inspection arrangement 1 with which planar substrates S, for example wafers, can be investigated microscopically. In the context of the invention described here, for example, the shift of two successive planes of a wafer is investigated in order to ascertain any misalignment of the individual planes. Inspection arrangement 1 is equipped, for that purpose, with a microscope 2. For image processing, microscope 2 can be equipped with a camera 3 having a CCD chip, the imaged microscopic subregion of the wafer being digitized.

Microscope 2 of inspection arrangement 1 can be directed onto a substrate S, in this case a wafer, located at an inspection location I. Inspection location I is enclosed by a housing 4 in which microscope 2 is simultaneously also received. Also provided in housing 4 is a conveying device 5 for transporting substrates S to and from inspection location I.

Inspection arrangement 1 furthermore encompasses a first magazine 6 for receiving several substrates S. Additionally provided is a transfer device 7 which transfers substrates S from first magazine 6 to conveying device 5. After inspection, substrates S are collected in a second magazine 8. A further transfer device 9 serves to transfer substrates S from conveying device 5 into second magazine 8. Magazines 6 and 8 are preferably embodied as replaceable magazines in which substrates S are stacked one above another. Each of magazines 6 and 8 is, for that purpose, coupled separately onto housing 3.

Inspection arrangement 1 furthermore encompasses an operating console 10 that is arranged on one side of housing 4 at operating position P. Provided for that purpose, on viewing port 12 for microscope 2 projecting out of housing 4, are two eyepieces 14 that extend over operating console 10.

In addition to viewing port 12 for microscope 2, a first viewing field 16 (display) for displaying an image or image area of substrate S, and a second viewing field 18 for direct viewing of substrate S or a subregion of substrate S, are provided on housing 4. The two viewing fields 16 and 18 are arranged at an inclination with respect to an operator 20 in such a way that operator 20, located in front of viewing port 12 of microscope 2, looks at the respective viewing field 16 and 18 in substantially perpendicular fashion. Also provided in housing 4 is at least one computer 22 that is also used, among other purposes, for processing the images acquired with microscope 2.

FIG. 2 schematically depicts a user interface 22 with which a user performs the overlay check or adjusts inspection arrangement 1 for the overlay check. On user interface 22, an overview image of substrate S is displayed in a first window 24. Substrate S is subdivided into multiple image windows 26 that can be imaged by microscope 2 of inspection arrangement 1. It is self-evident to one skilled in the art that the size of image window 26 depends on the selected magnification of microscope 2. Image window 28 currently being imaged by microscope 2 is displayed on user interface 22 as a solid rectangle. The center of substrate S is identified by a cross 30. A further cross 30 identifies an image window in which a pattern for determining the shift of two planes on substrate S is also located.

In a second window 32 on user interface 22, an image 34 of the current image window 28 imaged by means of camera 3 of microscope 2 is displayed. The acquired image encompasses at least one reference element 36 or measurement element on which the shift of two planes with respect to one another is to be determined. Reference element 36 encompasses at least one first pattern element 36a in a first plane 38, and at least one second pattern element 36b in a second plane 40. Although the description mentions only two planes whose overlay is to be determined, this is not to be construed as a limitation. It is equally conceivable for the measurement elements or reference elements 36 to comprise more than two pattern elements that are arranged in more than two different planes. The task is thus to ascertain the shift of the individual planes with respect to one another. Operator 20 selects the reference element in such a way that a border 42 is drawn around reference element 36. Operator 20 can do this by way of operating console 10 or a mouse (not depicted).

Provided above second and first windows 32 and 24 is a bar 44 that encompasses several click buttons 45. Each of click buttons 45 stands for a tool that operator 20 can call. The callable tools can encompass, for example, saving, calculation, measurement, magnification selection, image acquisition, etc. User interface 22 furthermore encompasses several subregions 46a, 46b, 46c, 46d that are provided for controlling the inspection arrangement or for outputting information for operator 20. A first subregion 46a concerns input and output of a substrate S into inspection arrangement 1. The data already saved in inspection arrangement 1 can also be managed here. Data already saved for overlay checks of previous substrates S can be retrieved, new data saved, or other data deleted. A second subregion 46b concerns focus and position determination for a substrate S. Here, for example, it is possible to select between a laser focus and a TV focus. A third subregion 46c concerns the detection and programming mode. Here, for example, the inspection arrangement can be used to program in an overlay shift that is then utilized for further measurements on substrates S of a batch. The limit values within which an overlay shift is still regarded as acceptable are defined in the programming mode. A fourth subregion 46d concerns the inspection position. Here operator 20 can store or edit several operating positions so that inspection arrangement 1 travels to the corresponding positions on the substrate.

A control element 47 is depicted on user interface 22 below first window 24. With control element 47, operator 20 can displace substrate S in such a way that a specific region is imaged by microscope 2 and camera 3. The displacement of substrate S can be accomplished with a conventional motor-controlled XYZ stage (not depicted). Also provided in the vicinity of control element 47 are several windows 48 which display, for example, the X position and Y position of the image window of substrate S that is currently located in the observation position of microscope 2. Further windows 49 display to operator 20 the row and column on substrate S in which the image window of substrate S currently being imaged is located.

First window 24 is moreover equipped with a plurality of tabs 50. Using the tabs, operator 20 can make selections such as Wafer Boat, Wafer Map, Statistic, Info, Gallery, etc.

Figure 3A:
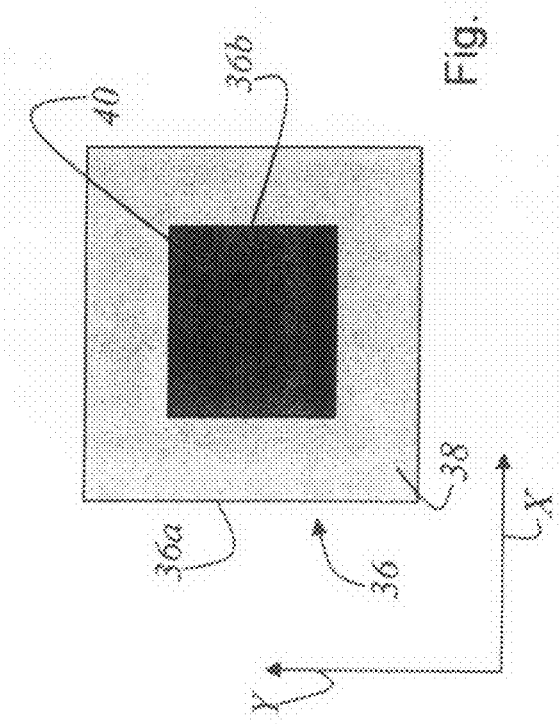
FIG. 3a is a schematic view of a first embodiment of a reference element with which the overlay is determined.
Figure 3B:
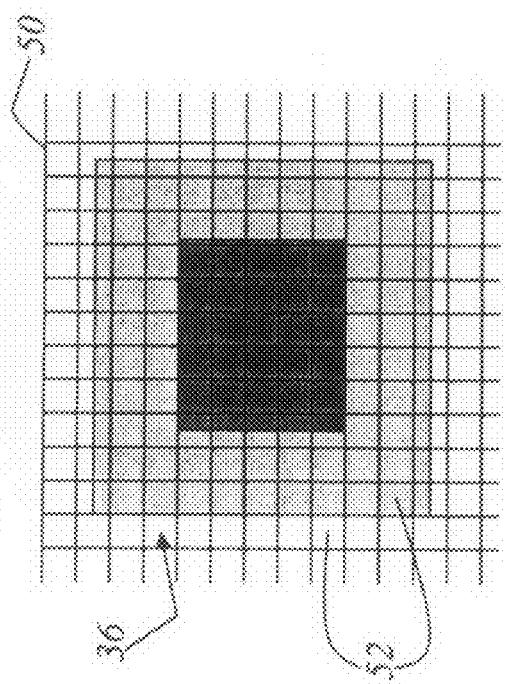
FIG. 3b is a schematic view of the first embodiment of the reference element with which the overlay is determined, the matrix of a CCD being superimposed.
Figure 4A:
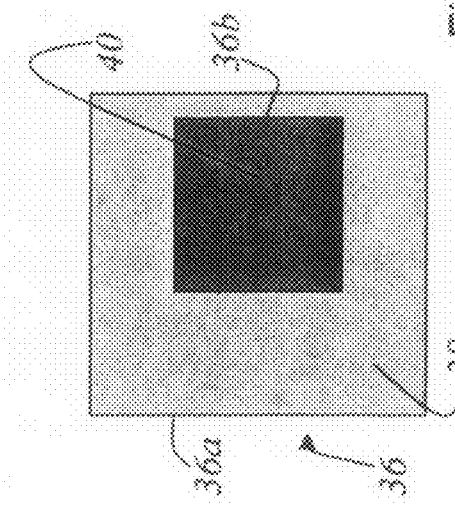
FIG. 4a is a schematic view of the first embodiment of the reference element with which the overlay is determined, the first plane being shifted with respect to the second plane.

FIG. 3a is a schematic view of a first embodiment of a reference pattern or reference element 36 with which the overlay is determined. Reference element 36 encompasses at least one first pattern element 36a in a first plane 38, and at least one second pattern element 36b in a second plane 40. Note that first plane 38 lies below second plane 40. FIG. 3b is a schematic view of the first embodiment of reference element 36 with which the overlay is determined, a matrix 50 of a CCD of camera 3 being superimposed on reference element 36. Matrix 50 of the CCD comprises a plurality of pixels 52 that acquire the image of reference element 36. As compared with FIG. 3a, FIG. 4a depicts a schematic view of the first embodiment of reference element 36 with which the overlay is determined, first plane 38 having been shifted with respect to second plane 40. The difference as compared with FIG. 3a results from a shift of second pattern element 36b in the X direction with respect to first pattern element 36a. A shift in the X direction and Y direction is likewise possible, but is not mentioned here for reasons of simplicity.

Figure 4B:
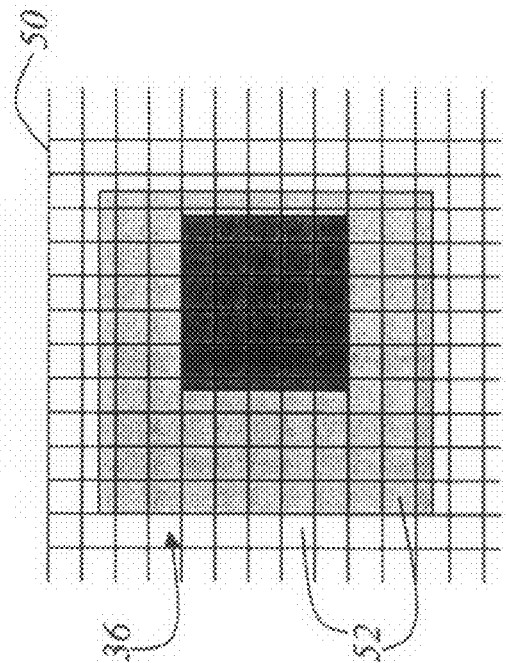
FIG. 4b is a schematic view of the first embodiment of the reference element, the first plane being shifted with respect to the second plane and the matrix of a CCD being superimposed.

FIG. 4b is a schematic view of the first embodiment of reference element 36, first plane 38 having been shifted with respect to second plane 40, and matrix 50 of the CCD of camera 3 being superimposed. The signals of individual pixels 52 of the CCD are employed to ascertain the shift. Determination of the overlay requires the presence of at least one substrate S or wafer that comprises reference elements having either a correct alignment or a known misalignment. From that substrate S or wafer, an image of the reference element is grabbed. This has already been described in FIGS. 3b and 4b. For example, individual pixels 52 of matrix 50 of a CCD acquire the image of reference element 36. Reference element 36 possesses patterns that are contained in both layers or planes whose mutual alignment is to be measured. Operator 20 must define which patterns belong to which layers. In the exemplary embodiment disclosed in FIG. 3a, this is a so-called box-in-box pattern, and definition is performed by drawing the rectangular border 42 (see FIG. 2). Patterns of any desired complexity are also, however, possible as reference elements (see FIG. 5 and FIG. 6). For determination of a shift value between reference element 36 and the at least one measurement element, a comparison is made between the image of reference element 36 and the image of the measurement element. The comparison is performed for each of the two planes 38 and 40 by sub-pixel-accuracy pattern matching against the image of reference element 36. Only the pattern elements of one plane or layer are searched for in each case. The misalignment M is calculated in accordance with equation 1:

$$M=((A-A_0)-(B-B_0))\times(\text{pixel size})+M_0, \quad \text{(Equation 1)}$$

where A denotes the position of first pattern element 36a in first plane 38 and B the position of second pattern element 36b in second plane 40 of pattern element 36 (FIG. 4a) in the measured image. Similarly, $A_0$ denotes the position of first pattern element 36a in first plane 38, and $B_0$ the position of second pattern element 36b in second plane 40 of pattern element 36 (FIG. 4a) in the reference image. $M_0$ is the misalignment of reference element 36 on substrate S or the reference wafer.

Figure 5A:
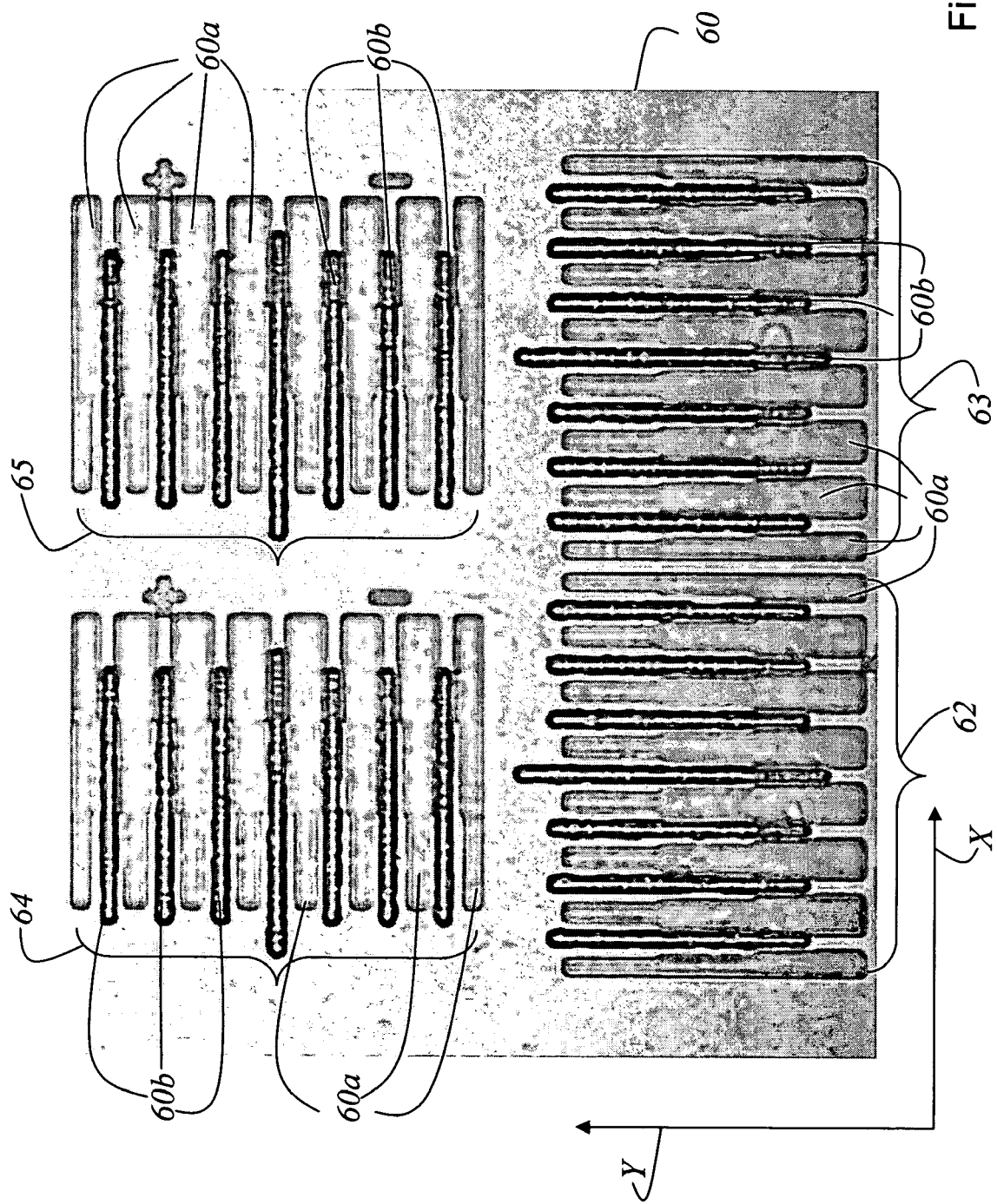
FIG. 5a is a view of a second embodiment of a reference pattern or reference element with which the overlay is determined.

FIG. 5a is a view of a second embodiment of a reference element (or reference pattern) 60 with which the overlay is determined. Reference pattern 60 comprises a plurality of first pattern elements 60a and a plurality of second pattern elements 60b. Reference element 60 is a comb-like pattern, first pattern elements 60a being arranged in a first plane and second pattern elements 60b in the second plane. Reference pattern 60 comprises a first sub-pattern 62, a second sub-pattern 63, a third sub-pattern 64, and a fourth sub-pattern 65. First and second sub-patterns 62 and 63 are arranged in such a way that longitudinal axes of first and second pattern elements 60a and 60b are parallel to the Y direction. Third and fourth sub-patterns 64 and 65 are arranged in such a way that longitudinal axes of first and second pattern elements 60a and 60b are parallel to the X direction. The depiction in FIG. 5a shows reference pattern 60 in which no shift exists between the first and second planes.

Figure 5B:
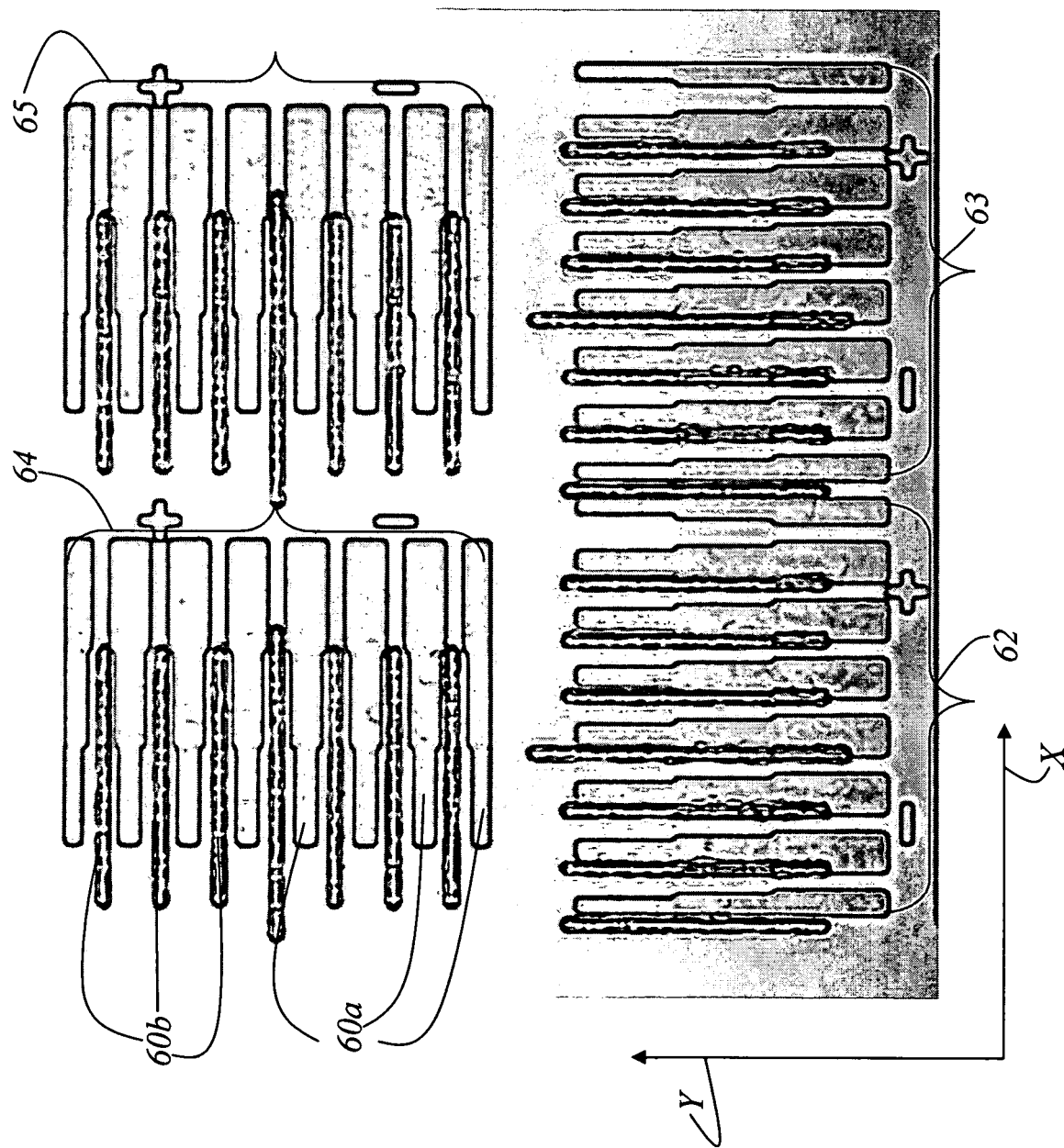
FIG. 5b is a schematic view of the second embodiment of the reference pattern or reference element with which the overlay is determined, the first plane being shifted in the X direction with respect to the second plane.

FIG. 5b is a schematic view of the second embodiment of reference pattern (or reference element) 60 with which the overlay is determined, the first plane being shifted in the X direction with respect to the second plane. The shift is evident from the fact that in first and second sub-patterns 62 and 63, second pattern elements 60b are shifted more toward first pattern elements 60a. In third and fourth sub-patterns 64 and 65, second pattern elements 60b and first pattern elements 60a are pulled apart in the X direction relative to one another. The magnitude of the shift is determined, as in the first exemplary embodiment, with sub-pixel accuracy.

Figure 6:
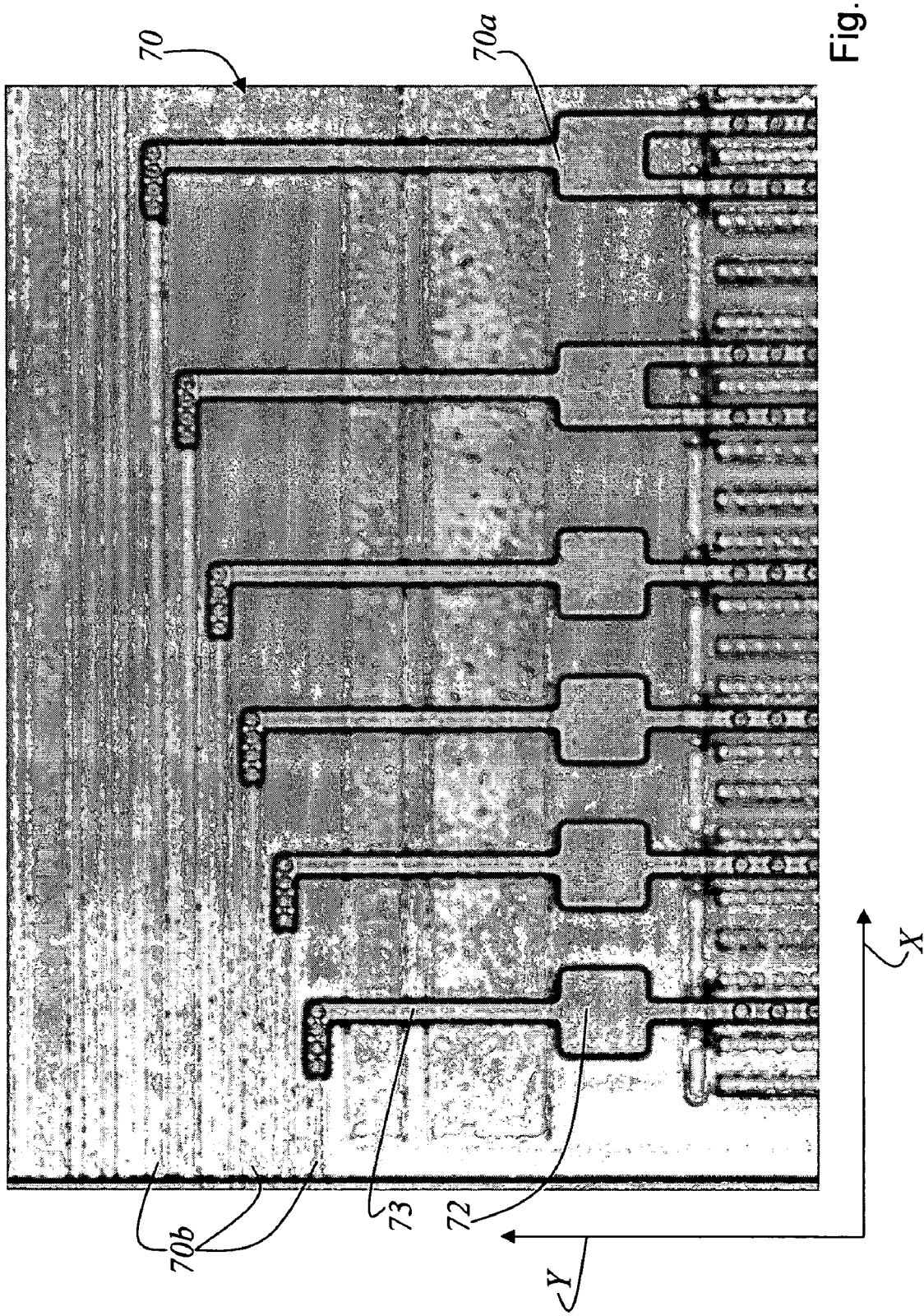
FIG. 6 is a view of a third embodiment of a pattern on the basis of which the overlay is checked.

FIG. 6 is a view of a third embodiment of a pattern on which the overlay of a first and a second plane is checked. Any pattern on a substrate S or wafer that has defined pattern elements in different planes is suitable for overlay checking. In the exemplary embodiment depicted in FIG. 6, reference pattern 70 comprises a first pattern element 70a and a second pattern element 70b. First pattern element 70a comprises a flat portion 72 and an angled extension 73. First pattern element 70a is arranged in a first plane. Adjoining the first pattern element is a second pattern element 70b that extends substantially parallel to the X direction. The second pattern element is arranged in a plane that differs from the first plane. A shift of the first plane with respect to the second would result, in this embodiment, in a defective transition from first pattern element 70a to second pattern element 70b.

What is claimed is:

1. A method for measuring overlay shift, comprising the following steps:
   acquiring an image of at least one reference element that has at least one first pattern element in a first plane and at least one second pattern element in a second plane;
   traveling to at least one measurement element and acquiring an image of the measurement element;
   ascertaining a shift value between the reference element and the at least one measurement element by comparing the image of the reference element with the image of the measurement element; and
   generating an output if the shift value between the reference element and the measurement element exceeds a predefined tolerance value.

2. The method as defined in claim 1, wherein several reference elements are imaged, and an average for evaluation of the measurement element is determined therefrom.

3. The method as defined in claim 1, wherein the first pattern element and the second pattern element are each constructed from an n-sided polygon.

4. The method as defined in claim 1, wherein the first pattern element and the second pattern element are each constructed from a regular rectangle.

5. The method as defined in claim 1, wherein the first pattern element and the second pattern element are each constructed from a square.

6. The method as defined in claim 1, wherein the reference element has a comb-like structure.

7. The method as defined in claim 6, wherein the reference element is constructed from a first, a second, a third, and a fourth sub-pattern, at least the third and the fourth sub-pattern being rotated 90° counterclockwise with respect to the first and the second sub-pattern.

8. The method as defined in claim 7, wherein the first and the second sub-pattern of the reference element are directly adjacent to one another and thus form a continuous comb element.

9. The method as defined in claim 1, wherein the reference element encompasses a region of a semiconductor substrate that comprises the first and second pattern elements arranged perpendicular to one another.

10. The method as defined in claim 1, wherein an operator selects a reference element in such a way that a border is drawn around the reference element.

11. The method as defined in claim 1, wherein the comparison between the image of the reference element and the image of the measurement element is performed using sub-pixel-accuracy pattern matching.

12. The method as defined in claim 1, wherein an operator defines the tolerance value for a misalignment between the first and the second plane.

13. The method as defined in claim 12, wherein the measurement element has at least one first pattern element in a first plane and at least one second pattern element in a second plane;

wherein the misalignment M is calculated in accordance with the equation:

$$M=((A-A_0)-(B-B_0))\times(\text{pixel size})+M_0$$

wherein A is a position of the first pattern element of the measurement element;

wherein B is a position of the second pattern element of the measurement element;

wherein $A_0$ is a position of the first pattern element of the reference element;

wherein $B_0$ is a position of the second pattern element of the reference element;

wherein $M_0$ is a known correct alignment or a misalignment between the first pattern element and the second pattern element of the reference element.

14. The method as defined in claim 13, wherein a measured value for the misalignment is a shift value, an individual value, an average, or a standard deviation.

15. The method as defined in claim 14, wherein the output is generated if the tolerance value is exceeded by N measured values, or if the average is exceeded by the tolerance value.

16. The method as defined in claim 15, wherein a user interface is provided with which an operator can make inputs and derive information concerning the measurement that has been performed.

17. The method as defined in claim 1, wherein the reference element has a known correct alignment or a misalignment between the first pattern element and the second pattern element.

18. The method as defined in claim 1, wherein the measurement element has at least one first pattern element in a first plane and at least one second pattern element in a second plane.

19. A method for measuring overlay shift of a semiconductor substrate, comprising the following steps:

acquiring an image of at least one reference element of a semiconductor substrate, wherein the reference element has at least one first pattern element in a first plane of the substrate and at least one second pattern element in a second plane of the substrate;

traveling to at least one measurement element of the substrate and acquiring an image of the measurement element;

ascertaining a shift value between the reference element and the at least one measurement element by comparing the image of the reference element with the image of the measurement element; and generating an output if the shift value between the reference element and the measurement element exceeds a predefined tolerance value.

* * * * *